(12) United States Patent
Lindsey, Jr.

(10) Patent No.: US 9,153,493 B1
(45) Date of Patent: Oct. 6, 2015

(54) SYSTEM FOR SEPARATING DEVICES FROM A SEMICONDUCTOR WAFER

(71) Applicant: MICRO PROCESSING TECHNOLOGY, INC., Lafayette, CA (US)

(72) Inventor: Paul C. Lindsey, Jr., Lafayette, CA (US)

(73) Assignee: Micro Processing Technology, Inc., Lafayette, CA (US)

(*) Notice: Subject to any disclaimer, the term of this patent is extended or adjusted under 35 U.S.C. 154(b) by 166 days.

(21) Appl. No.: 13/742,562

(22) Filed: Jan. 16, 2013

(51) Int. Cl.
*H01L 21/00* (2006.01)
*H01L 21/78* (2006.01)

(52) U.S. Cl.
CPC .................................... *H01L 21/78* (2013.01)

(58) Field of Classification Search
None
See application file for complete search history.

(56) References Cited

U.S. PATENT DOCUMENTS

| 5,501,893 | A | 3/1996 | Laermer et al. |
| 6,417,013 | B1 | 7/2002 | Teixeira et al. |
| 7,045,035 | B1* | 5/2006 | Kelkar et al. ............... 156/716 |
| 8,445,361 | B1* | 5/2013 | Lindsey, Jr. ................. 438/462 |
| 2001/0017403 | A1* | 8/2001 | Kurosawa et al. ........... 257/651 |
| 2011/0179934 | A1* | 7/2011 | Soyama ......................... 83/875 |

\* cited by examiner

*Primary Examiner* — Charles Garber
*Assistant Examiner* — Abdulfattah Mustapha
(74) *Attorney, Agent, or Firm* — Thomas R. Lampe

(57) ABSTRACT

A system for separating semiconductor devices from a wafer having back metal exposed in scribe streets of the wafer positioned on a plastic film by applying a variable radial force to stretch and tension the film while controlling the stretch and tension as a function of a control parameter.

9 Claims, 5 Drawing Sheets

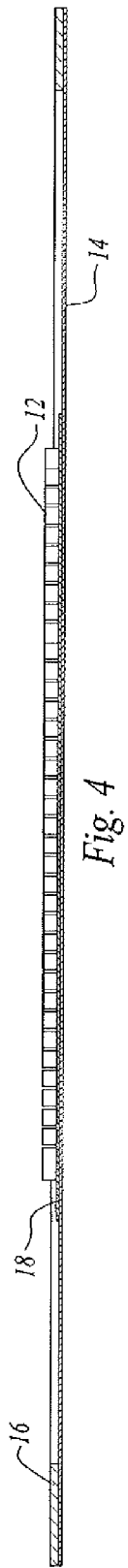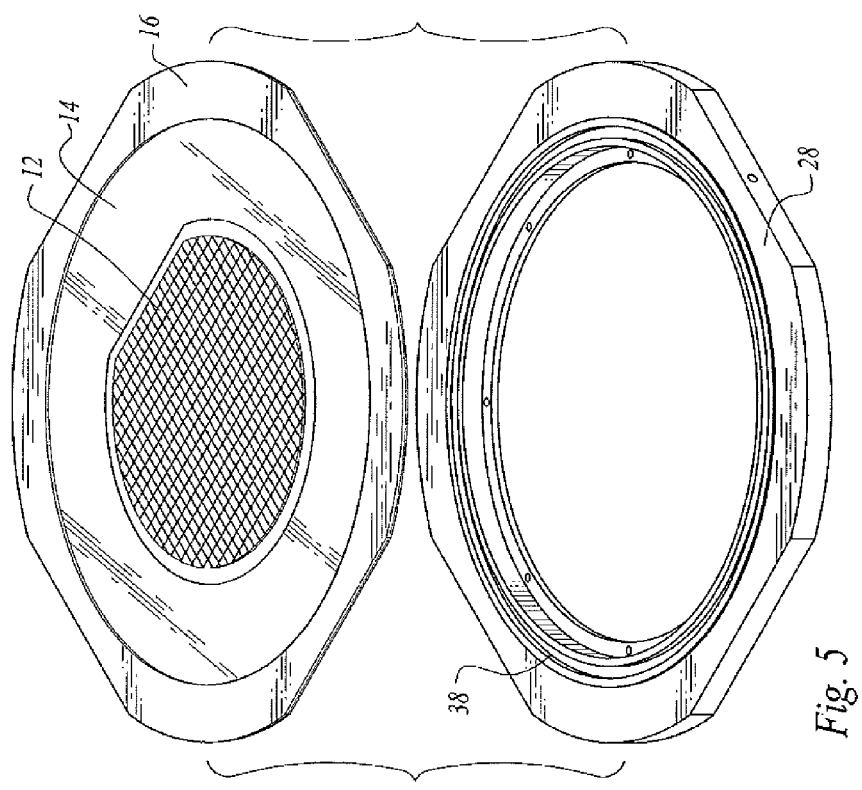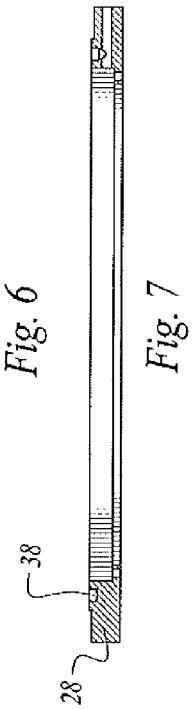

SYSTEM FOR SEPARATING DEVICES FROM A SEMICONDUCTOR WAFER

TECHNICAL FIELD

The present invention relates to an apparatus and method for separating semiconductor devices from a semiconductor wafer, and more particularly to separating devices from a wafer having back metal on the backside thereof positioned on a plastic film.

BACKGROUND OF THE INVENTION

In the past, numerous different approaches have been used for singulating or dicing a semiconductor wafer, the process of dividing a semiconductor wafer into individual devices. The two most widely used methods at this time are sawing using a diamond saw blade and laser scribing using a focused laser beam to cut through the wafer. Neither method is ideal. Both result in a significant loss of material during the cutting process. As the size of semiconductor devices get smaller, the width of the line of lost material during the scribing process becomes comparable to the width of the device. If the width of the line of material lost during the scribing process could be made significantly smaller, many more devices could be made on each wafer, resulting in a large savings in the cost of fabricating the devices.

Another method of wafer dicing, scribe-and-break, uses a tool with a diamond point or edge to create a line of stress between the devices to be separated and then another apparatus breaks the wafer along this line.

All three of these methods can cause damage along the cut edges of the devices that can result in rejected devices during visual inspection and in some cases cracking that can cause device failure in the field.

Since the invention of plasma and reactive ion etching in the 1970s, many individuals have proposed using these processes for wafer singulation. These processes potentially could decrease the material loss during the dicing process by etching very narrow scribe lines through the semiconductor wafer. In addition, since the etch process takes place at a microscopic level and involves no material melting or mechanical grinding, the edge of the semiconductor devices are not damaged by the process. In order for a plasma etching or a reactive ion etching process to be effective in wafer dicing, it would have to etch very deep, narrow trenches in the scribe streets of the semiconductor wafer and it would have to etch at a very fast etch rate to be economically attractive. These two conditions have been achieved in the last several years by the approach disclosed in Teixeira et al. U.S. Pat. No. 6,417,013 building on the work disclosed in Laermer et al. U.S. Pat. No. 5,501,893. The single issue that remains to be resolved is a cost effective method of separating the back metal that remains in the scribe streets after the etch process is completed.

Semiconductor wafers usually have back metal comprising one or more metal layers applied to the back of the wafer during fabrication to provide ohmic contact and/or ease of die attach during packaging of the devices. These layers of metal are not readily etched using dry etch processes. This invention teaches a method and apparatus to effectively separate these metal layers in the semiconductor wafer scribe streets.

It is current practice to mount the semiconductor wafer to be diced or singulated on a plastic film that is stretched across a metal or plastic frame. When using a scribe-and-break process, after the process has been completed the diced wafer is examined to ensure that the back metal has been separated between all of the devices. If the metal is not separated between any devices, it is common practice to manually press a stylus against the backside of the plastic film causing the film to deform upward and stretch causing the back metal to separate in this region.

DISCLOSURE OF INVENTION

In efforts to build an apparatus that will use a stylus to separate the back metal between all of the devices after etching, applicant has discovered that for the process to be repeatable and to produce a high yield of separated devices, it is essential to control the tension in and stretch of the plastic film during the process. It is known to those skilled in the art that it is necessary to control the radius of the stylus and the force or position of the pressing of the stylus into the plastic film. However, applicant has discovered that it is equally important to control the tension and stretch of the film.

During the etching process, the plastic film is exposed to harsh chemicals and heat that can cause the film to stretch and lose tension on the mounting frame. In the process of this invention prior to applying the stylus to the back side of the film and wafer the film is stretched to reestablish the tension in the film. The initial approach was to stretch and tension the film as much as possible while keeping it in the regime of its elastic deformation. Surprisingly this did not give a high yield of separated devices. It was observed that before and during the application of the stylus, breaks would occur in the back metal films. These breaks are generally in lines in one or both directions between the devices and can extend for some distance, sometimes all the way to the edges of the wafer. It was found that when the plastic film was stretched a large amount before the stylus was applied, the film would deform more in the broken lines than between the adjacent devices that were not yet separated. The excess deformation in the previously broken lines prevents adequate deformation of the plastic film under the back metal in the adjacent lines and results in the metal not breaking between these devices. This dramatically reduces the yield of separated devices. This effect was observed when a stretch (strain) of 3.0% to 3.5% was applied to the film. If the stretch (strain) applied to the film is kept to a lower range of 0.5% to 1.0% this effect is avoided. It is, therefore, essential to include precise control of the plastic film stretch and tension in order to achieve high yields of die separation and to make this process economically viable.

When one wishes to control the stretch and tension in the plastic film, simply moving all parts of the film outward a certain distance in a radial direction does not achieve the desired results. This is because the stretch and tension in the film after the plasma etching has been completed is unknown. In some cases, the stretch and tension in the film may be negative; that is, the film is sagging in the frame. It is necessary to devise an apparatus and method to provide a variable radial force on the film and to provide a method of calibrating and controlling the relationship between a control parameter and the stretch of the film.

This invention relates to a method of separating semiconductor devices of a semiconductor wafer including back metal on the back side thereof positioned on a plastic film.

The method includes the step of removing the semiconductor material in scribe streets between the semiconductor devices until the back metal is exposed in the scribe streets.

After removing the semiconductor material in the scribe streets, a variable radial force is applied to the plastic film to radially stretch and tension the plastic film. The stretch and tension of the plastic film is controlled as a function of a control parameter.

A stylus is pressed against the back side of the semiconductor wafer while in engagement with the tensioned plastic film to cause the plastic film to further deform and stretch in the immediate region where the stylus presses, causing the back metal in the scribe streets located in that region to separate.

The stylus is moved across the semiconductor wafer while engaging the plastic film to further deform and stretch different regions of the plastic film and while pressing the stylus against the semiconductor wafer to cause the back metal in the scribe streets in the different regions to separate.

The invention also encompasses apparatus for separating semiconductor devices from a semiconductor wafer including back metal on the back side thereof positioned on a plastic film, the semiconductor material in scribe streets between the semiconductor devices of the semiconductor wafer having been removed and the back metal exposed in the scribe streets.

Other features, advantages and objects of the present invention will become apparent with reference to the following description and accompanying drawings.

BRIEF DESCRIPTION OF DRAWINGS

FIG. 4 is a greatly enlarged cross-sectional, side view illustrating a semiconductor wafer including metal on the back side thereof positioned on a plastic film held by a frame;

FIG. 5 is an exploded view showing the frame supported semiconductor wafer positioned over a chuck having a vacuum channel;

FIG. 6 is a top, plan view of the chuck with vacuum channel;

FIG. 7 is a cross-sectional view taken along the line 7-7 of FIG. 6;

MODES FOR CARRYING OUT THE INVENTION

Figure 1:
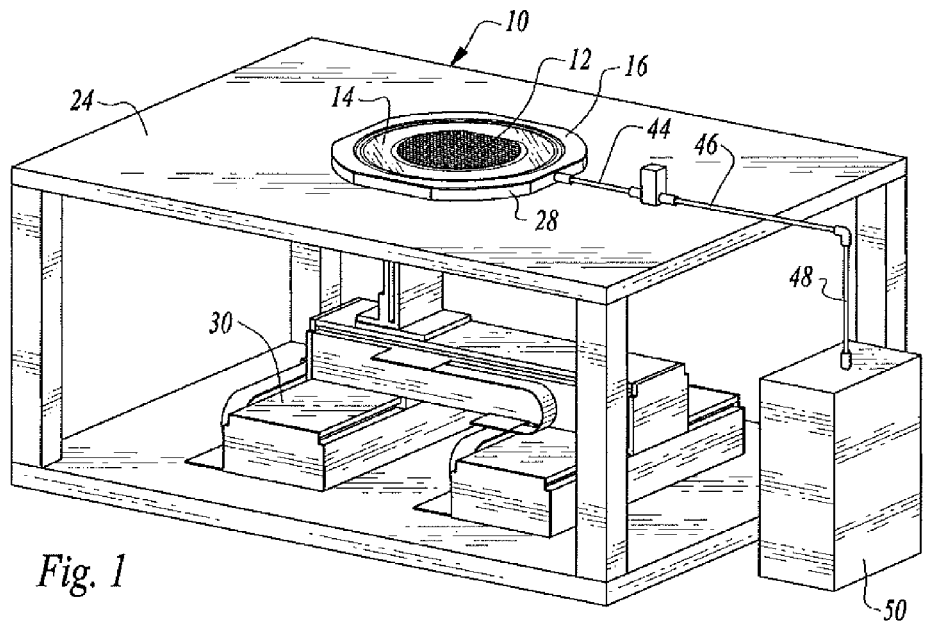
FIG. 1 is a perspective view illustrating a semiconductor wafer positioned on a chuck of an embodiment of the machine utilized to carry out the method of the invention.

Referring now to FIGS. 1-12, a first embodiment of apparatus utilized to carry out the teachings of the present invention is illustrated and designated by reference numeral 10. The apparatus is for separating semiconductor devices from a semiconductor wafer including back metal on the back side thereof positioned on a plastic film. Such a wafer is designated by reference numeral 12. FIGS. 1, 4, 5 and 8-12 show a plastic film 14 on which the back side of the semiconductor wafer is positioned. As is conventional, a support frame 16 (see FIGS. 4, 5, 8 and 9) supports a peripheral portion of the plastic film surrounding the wafer, as is conventional practice.

Back metal 18 of the wafer is positioned on the film as is also conventional practice. In the condition shown in the drawings, the wafer is in a condition wherein a rapid, anisotropic etching process has been used to remove all of the semiconductor material in the scribe streets, the etching process having been continued until the back metal has been reached and exposed as shown in FIGS. 4, 5 and 10-12. The semiconductor devices 20 of the wafer are thus only connected together by the back metal in the scribe streets.

Apparatus 10 includes a support table 24 defining an opening 26 (see FIG. 3) and further includes a chuck 28 surrounding the opening which holds the wafer, plastic film and frame in place while controlling the stretch and tension of the plastic film.

Figure 2:
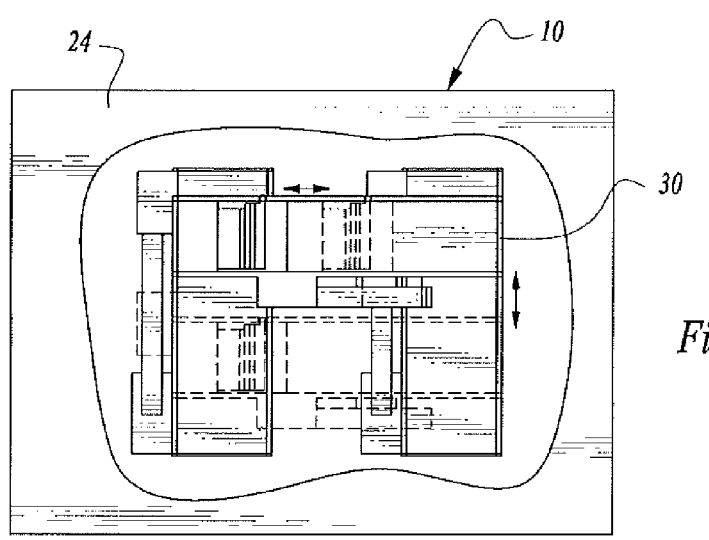
FIG. 2 is a top, plan view of the upper platform of the machine broken away to illustrate a three-axis motion stage of the apparatus for supporting and moving a stylus.
Figure 3:
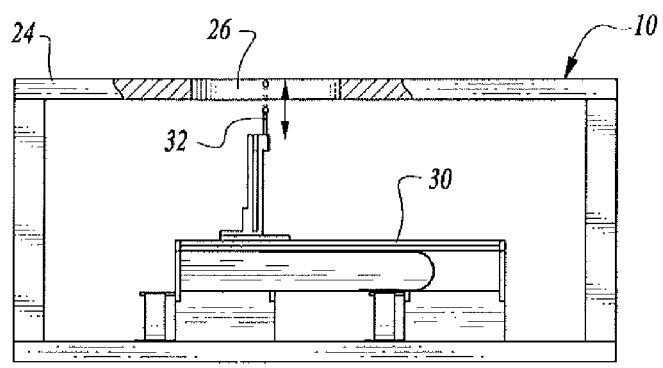
FIG. 3 is a side, elevational view of the machine illustrating the stylus in elevated and retracted positions.
Figure 8:
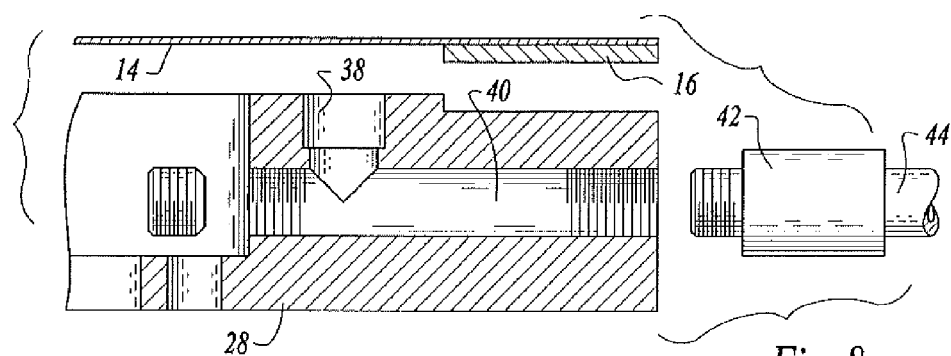
FIG. 8 is an enlarged, cross-sectional view illustrating portions of the chuck and plastic film holding frame prior to engagement and prior to engagement between the chuck and a vacuum conduit fitting.
Figure 10:
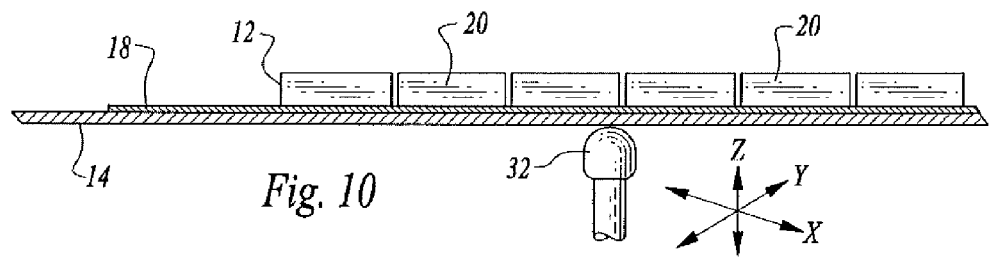
FIG. 10 is a greatly enlarged, elevational view in partial cross-section illustrating the stylus in engagement with the bottom of the plastic film during support of the plastic film and semiconductor wafer by the frame and chuck.

FIGS. 1 and 2 show the complete arrangement of the first embodiment, the apparatus also including a three-axis motion system 30 which moves and holds a stylus 32 under the wafer 12 held in place by chuck 28. FIGS. 2 and 3 illustrate by means of double-headed arrows the three-axis movement capability of the stylus. In FIG. 3 the stylus is depicted in a low position by solid lines and in an elevated position by dash lines. FIG. 10 also provides a diagrammatic illustration of three-axis movement in planes X, Y and Z.

Figure 9:
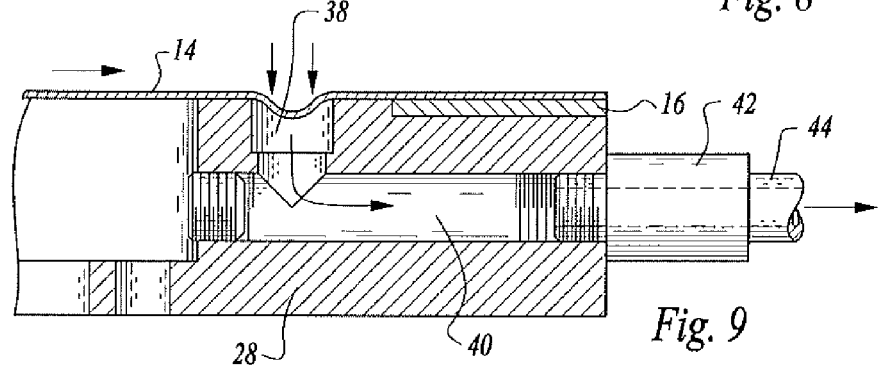
FIG. 9 is a view similar to FIG. 8, but illustrating the frame in engagement with the chuck and the fitting attached to the chuck, the vacuum conduit in fluid flow communication with the interior of the chuck and the chuck channel with vacuum induced air flow being illustrated by means of arrows causing downward movement of the plastic film in the channel and stretching of the plastic film.

The chuck 28 has an upper chuck surface and an open circular channel 38 extends downwardly from the upper chuck surface. When the frame 16 is positioned on the chuck, as shown in FIG. 9 for example, the plastic film is located over the channel 38 and in engagement with the upper check surface on both sides of the channel. The portion of the plastic film located over the channel is a circular film portion located between the mounting frame 16 and the semiconductor wafer.

Vacuum channel 38 is in communication with an air flow passageway 40 formed in the chuck. A fitting 42 (see FIGS. 8 and 9) is threadedly engaged with the chuck and provides air flow communication between the air flow passageway 40 and a conduit 44 leading to a vacuum controller 46. In turn, a conduit 48 connects the vacuum controller to a vacuum source 50. FIG. 9 shows the stretch and tension of the plastic film being controlled by the vacuum applied to the vacuum channel 38 of the chuck.

For different amounts of vacuum applied to the vacuum channel by the vacuum controller, ambient air pressure presses the film into the channel by different amounts giving precise control of the stretch and tension of the film. Stretch and tension in plastic films made of different materials and of different thicknesses are calibrated by measuring the stretch (strain) of the film as a function of the applied vacuum. That is, the illustrated arrangement provides control structure controlling the stretch and tension of the plastic film as a function of a control parameter.

Figure 11:
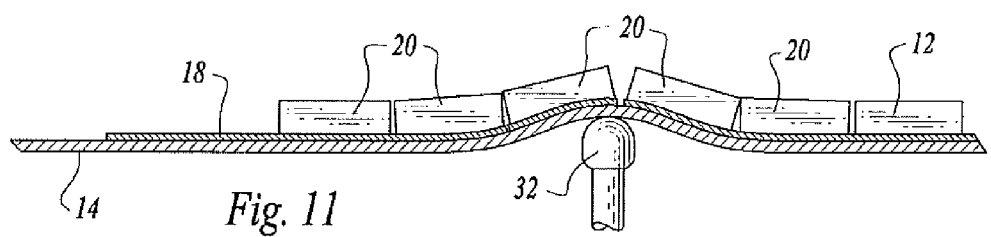
FIG. 11 is a view similar to FIG. 10, but illustrating the stylus pressing against the back side of the semiconductor wafer while in engagement with the tensioned plastic film in the immediate region where the stylus presses, causing the back metal in the scribe streets located in the region to separate.

The stylus 32 is pressed against the back side of the semiconductor wafer while in engagement with the tensioned film by the three-axis motion system 30. This further deforms and stretches the film in the immediate region where the stylus is pressing, causing the back metal in the scribe streets located in the region to separate. This is illustrated in FIG. 11.

Figure 12:
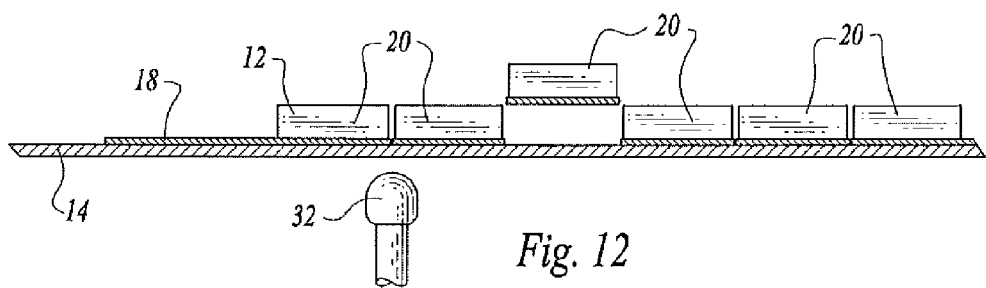
FIG. 12 is a view similar to FIGS. 10 and 11, but illustrating the stylus retracted and moved to a different region of the plastic film as well as a separated device being removed from the semiconductor wafer.
Figure 13:
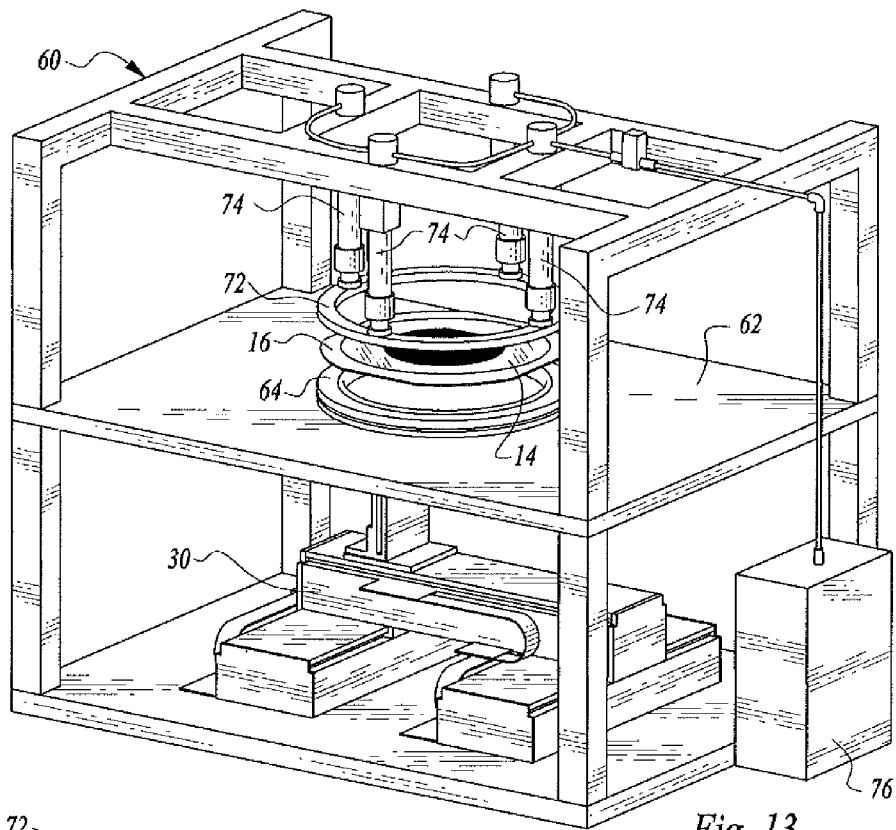
FIG. 13 is a perspective view of an alternative form of machine utilized to carry out the method of the present invention, a plastic film supported semiconductor wafer illustrated in the process of being positioned on a cylindrical shaped air bearing.
Figure 14:
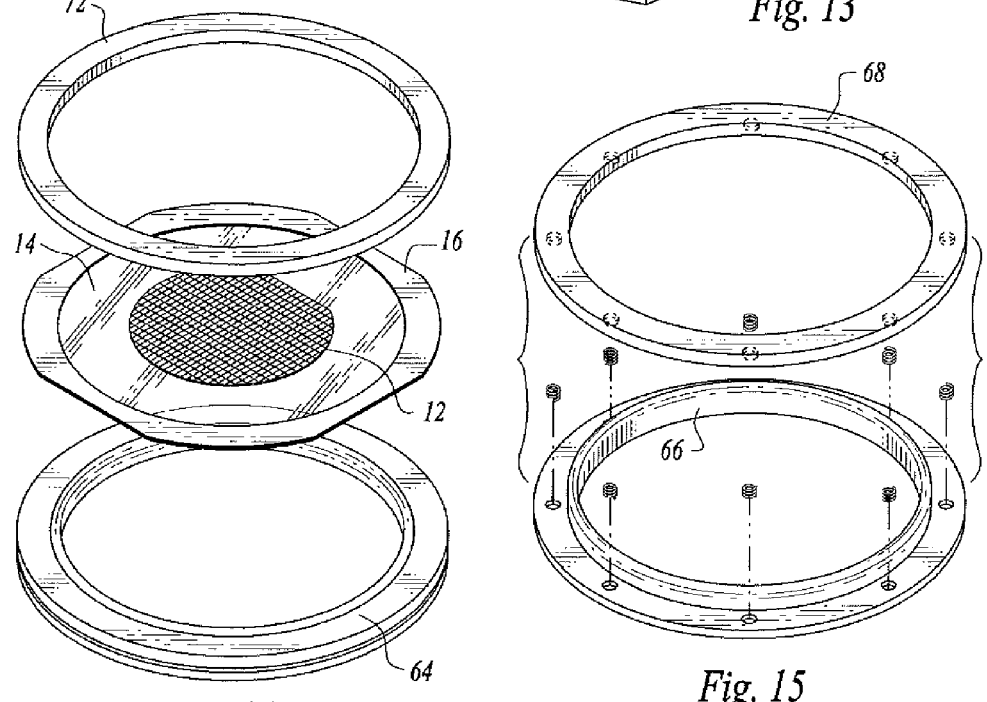
FIG. 14 is a perspective, exploded view illustrating the frame held plastic film supported wafer disposed over the air bearing and positioned under a force ring of the apparatus.
Figure 15:
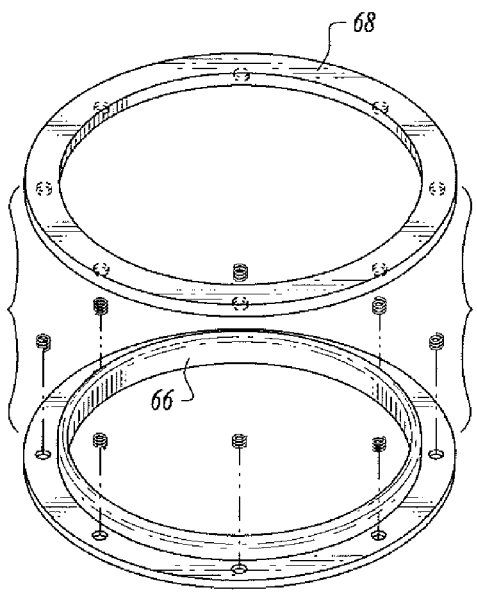
FIG. 15 is an exploded, perspective view illustrating components of the air bearing.

The stylus moving structure comprising the three-axis motion system moves the stylus across the semiconductor wafer and engages the plastic film to further deform and stretch different regions of the plastic film and while pressing against the semiconductor wafer to cause separation of the back metal in the scribe streets in the different regions. FIG. 12 shows the stylus having been moved to another position under the film and a semiconductor device no longer connected by the back metal to the other devices being removed.

FIGS. 13-18 illustrate a second embodiment of apparatus utilized to carry out the steps of the method of this invention wherein the stretch and tension of the plastic film is variable and controlled as a function of a control parameter.

Apparatus 60 includes a support table 62 defining an opening (not shown) therein, which may be the same shape as opening 26 of the first apparatus embodiment 10. Below the support table 62 and the opening is a three-axis motion system 30 for moving a stylus (not shown) the same or similar to that incorporated in apparatus 10. The three-axis motion system and stylus operate in the manner of the first apparatus embodiment.

In this second apparatus embodiment 60, rather than a vacuum chuck being used to support the frame, plastic film and wafer, a large, cylindrical air bearing 64 is employed. The air bearing includes a center or inner air bearing element 66 and outer air bearing element 68.

The center or inner air bearing element 66 is held fixed to the support table 62 with the interior thereof over the opening in the support table. Outer air bearing element 68 is telescopically movable relative to inner air bearing element 66, compression springs 70 continuously urging the outer air bearing element upwardly toward the position shown in FIGS. 16 and 17.

Located above outer air bearing element 68 is a force ring 72 connected to downwardly extending pneumatic cylinders 74. The pneumatic cylinders are connected by conduits to a pressurized air source 76.

Figure 16:
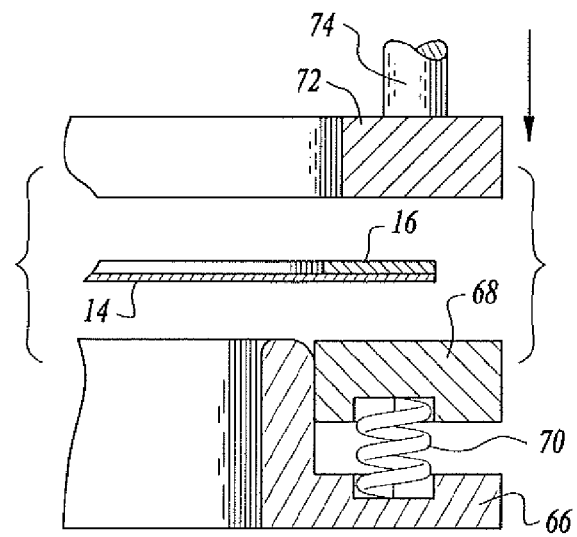
FIG. 16 is an elevational, exploded view illustrating portions of the air bearing, the frame supported plastic film and the force ring prior to engagement.
Figure 17:
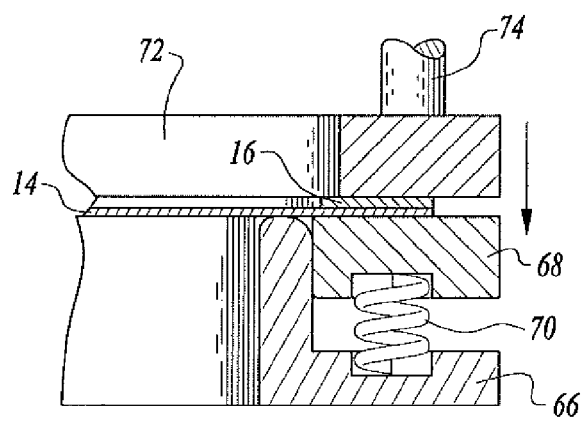
FIG. 17 is a view similar to FIG. 16, but illustrating the force ring making initial engagement with the frame and the plastic film engaging an outer air bearing element.
Figure 18:
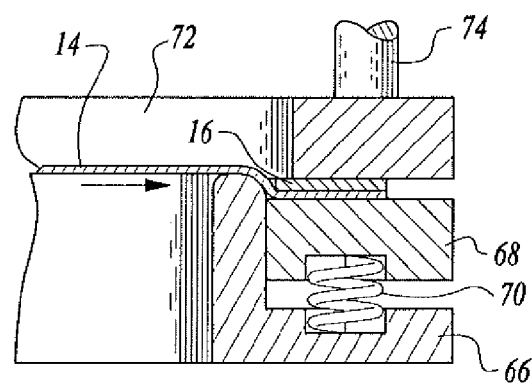
FIG. 18 shows the force ring, frame and outer air bearing element moved downwardly relative to the inner air bearing element to stretch the plastic film, a segment of the plastic film engaging an upper peripheral surface of the inner air bearing element.

During operation of apparatus 60, the frame 16 holding plastic film 14 and wafer 12 is positioned so that the plastic film disposed under the frame 16 is positioned on the upper surface of outer air bearing element 68 as shown in FIGS. 16 and 17. After this has been done, the pneumatic cylinders 74 are pressurized to move the force ring into engagement with the frame 16 as shown in FIG. 17. Further downward movement of the force ring by the pneumatic cylinders using a controlled force causes the film to stretch and the tension in the film to increase as illustrated in FIG. 18. The air pressure controller 78 is utilized to vary the pressure applied to the pneumatic cylinders. By using different quantities of force applied to the force ring 72, precise control of the stretch and tension of the film can be achieved. The stretch and tension in the plastic film is calibrated by measuring the stretch of the plastic film as a function of the applied force. The pneumatic cylinders used should be an anti-stiction type such as those manufactured by Airpot Corporation.

Another possible approach to pressing down on the force ring could be accomplished by employing voice coils and varying the current to the voice coils to control the force.

The invention claimed is:

1. A method of separating semiconductor devices of a semiconductor wafer including back metal on the backside thereof positioned on a planar plastic film, said method comprising the steps of:

removing the semiconductor material in scribe streets between said semiconductor devices until the back metal is exposed in said scribe streets;

after removing the semiconductor material from the scribe streets, supporting the plastic film on a support structure having a support surface spaced from and surrounding the semiconductor wafer;

with the planar plastic film supported on the support surface spaced from and surrounding the semiconductor wafer, at said support structure applying a variable radial force to said planar plastic film spaced from and extending completely about the periphery of said semiconductor wafer to radially stretch and tension the planar plastic film in all radial directions in the plane of the planar plastic film;

controlling the radial stretch and tension of the planar plastic film as a function of a control parameter;

while maintaining control of the radial stretch and tension of the planar plastic film pressing a stylus against the semiconductor wafer while in engagement with the radially stretched and tensioned planar plastic film to cause the plastic film to further deform and stretch in the immediate region where the stylus presses, causing the back metal in the scribe streets located in said region to separate; and moving the stylus across the semiconductor wafer and engaging the radially stretched and tensioned planar plastic film to further deform and stretch different regions of the plastic film and while pressing the stylus against the semiconductor wafer causing the back metal in the scribe streets in said different regions to break and separate.

2. The method according to claim 1 including the step of calibrating the relationship between the control parameter and stretch of the plastic film.

3. The method according to claim 2 wherein said variable radial force is applied by applying a vacuum to a portion of said plastic film surrounding and spaced from said semiconductor wafer.

4. The method according to claim 3 wherein the stretch and tension in the plastic film is calibrated by measuring the stretch of the plastic film as a function of the applied vacuum.

5. The method according to claim 3 wherein said support structure is a chuck and the support surface is a chuck surface, said plastic film being positioned on the chuck surface over a vacuum channel of the chuck spaced from and surrounding said semiconductor wafer.

6. The method according to claim 2 wherein said support structure is a frame support and wherein said plastic film is held by a frame mounted on a support surface of said frame support, said frame support having first and second frame support members telescopically movable relative to one another, said radial force being applied by said frame and said frame support during telescoping of said first and second frame support members.

7. The method according to claim 6 wherein said first frame support member is an outer air bearing element and wherein said second support member is an inner air bearing element, telescoping of said outer bearing element and said inner air bearing element being caused by pressurizing at least one pneumatic cylinder operatively associated therewith.

8. The method according to claim 7 wherein the pressure of the air used to activate said at least one pneumatic cylinder is varied by an air pressure controller.

9. The method according to claim 8 wherein the stretch and tension in the plastic film is calibrated by measuring the stretch of the plastic film as a function of the air pressure of the at least one air cylinder.

* * * * *